(12) United States Patent
Murakoshi et al.

(10) Patent No.: US 7,394,066 B2
(45) Date of Patent: Jul. 1, 2008

(54) ELECTRON MICROSCOPE AND ELECTRON BEAM INSPECTION SYSTEM

(75) Inventors: Hisaya Murakoshi, Tokyo (JP); Masaki Hasegawa, Sayama (JP); Hideo Todokoro, Hinode (JP)

(73) Assignee: Hitachi High-Technologies Corporation, Tokyo (JP)

( * ) Notice: Subject to any disclaimer, the term of this patent is extended or adjusted under 35 U.S.C. 154(b) by 376 days.

(21) Appl. No.: 11/180,671

(22) Filed: Jul. 14, 2005

(65) Prior Publication Data

US 2006/0011835 A1 Jan. 19, 2006

(30) Foreign Application Priority Data

Jul. 15, 2004 (JP) .............................. 2004-208871

(51) Int. Cl.
*G21K 7/00* (2006.01)
(52) U.S. Cl. .................. 250/310; 250/397; 250/306; 250/307
(58) Field of Classification Search ................. 250/310, 250/397, 306, 307
See application file for complete search history.

(56) References Cited

U.S. PATENT DOCUMENTS 5,969,356 A * 10/1999 Grzelakowski ............... 250/310
6,759,654 B1 * 7/2004 Mankos et al. ............... 250/307
7,022,987 B2 * 4/2006 Preikszas et al. ............. 250/310
2002/0148975 A1 * 10/2002 Kimba et al. ................ 250/492.1
2003/0127593 A1 * 7/2003 Shinada et al. .............. 250/310

FOREIGN PATENT DOCUMENTS

| JP | 7-249393 | 9/1995 |
| JP | 10-197462 | 7/1998 |
| JP | 2003-202217 | 7/2003 |

OTHER PUBLICATIONS

Marian Mankos, et al., "Imaging Hot-Electron Emission from Metal-Oxide-Semiconductor Structures", 1996 The American Physical Society, pp. 3200 and 3203.
R.M. Tromp, "Low-Energy Electron Microscopy", IBM J. Res. Develop., vol. 44, No. 4 Jul. 2000, pp. 503-516.

* cited by examiner

*Primary Examiner*—Jack I. Berman
*Assistant Examiner*—Michael J Logie
(74) *Attorney, Agent, or Firm*—Antonelli, Terry, Stout & Kraus, LLP.

(57) ABSTRACT

An electron microscope includes an illuminating lens system that illuminates an electron beam that is emitted from an electron source onto a specimen as a planar illuminating electron beam having a two-dimensional spread, an imaging lens system that projects and magnifies the reflecting electron beam emitted from the specimen to project and form a specimen image, a beam separator that separates the illuminating electron beam from the reflecting electron beam, and a controller. The controller controls the reflecting electron beam so as to go straight through the beam separator, and the illuminating electron beam so as to keep a deflection angle of the illuminating electron beam which is made by the beam separator substantially constant.

6 Claims, 8 Drawing Sheets

α=0.414

ELECTRON MICROSCOPE AND ELECTRON BEAM INSPECTION SYSTEM

CLAIM OF PRIORITY

The present invention claims priority from Japanese application JP 2004-208871 filed on Jul. 15, 2004, the content of which is hereby incorporated by reference to this application.

FIELD OF THE INVENTION

The present invention relates to an electron microscope such as a mirror electron microscope which observes a surface state of a specimen (semiconductor specimen, etc.), and an electron beam inspection technique that inspects a pattern defect formed in the specimen by using the electron microscope.

BACKGROUND OF THE INVENTION

As a method of detecting defects of a circuit pattern formed on a wafer due to an image comparison inspection in a process of manufacturing a semiconductor device, electron beams are illuminated onto the specimen with the results that there remains fine etching residuals which is equal to or smaller than the resolution of an optical microscope, thereby making it possible to detect a configuration defect such as a fine pattern defect or detect an electric defect such as a non-aperture defect of a fine through-hole.

In this example, in a system using a scanning electron microscope that scans the specimen with point electron beams, there is a limit to obtain a practical inspection speed. Therefore, there has been proposed a device that conducts inspection at a high-speed through a so-called projection system such that a rectangular electron beam is illuminated onto a semiconductor wafer, and secondary electrons, backscattered electrons or electrons that are reflected without being illuminated onto the wafer due to the production of a reverse electric field are imaged by a lens (refer to, for example, Japanese Patent Application Laid-Open No. 7-249393, Japanese Patent Application Laid-Open No. 10-197462, and Japanese Patent Application Laid-Open No. 2003-202217).

However, the projection system using the secondary electrons or the mirror electrons suffers from the following problems.

The device that magnifies and projects the image of the secondary electrons or backscattered electrons as the detected electrons is called "low energy electron microscope". In this system, it is expected that images are formed rapidly compared with that in an SEM (scanning electron microscope) because a beam current is larger than that of the SEM, and the images can be acquired at once. However, the emission angle distribution of the secondary electrons are spread at a wide angle, and the energy is also wide spread from about 1 to 10 eV. It can be readily understood that the image with sufficient resolution cannot be obtained unless most of secondary electrons are cut (reference document: FIG. 6 disclosed in "LSI testing symposium/1999 conference minutes, P142"). The resolution is substantially 0.2 μm when a voltage supplied to a specimen is −5 kV according to a relationship between the imaging resolution of the secondary electrons and a negative voltage supplied to the specimen for accelerating the secondary electrons that have been emitted from the specimen.

Then, all of the secondary electrons cannot be used for image formation. For example, in the calculation of the above document, a beam having an opening angle of 1.1 mrad or less is used in an image plane that has passed through an objective lens. The secondary electrons within a range of the opening angle are about 10% of the entire secondary electrons at the highest. In addition, calculation is made assuming that the energy width of the secondary electrons used for imaging is 1 eV, but the energy width of the secondary electrons actually has several eV or more for emission, and a base at the higher energy side exists up to 50 eV. In the case where only the secondary electrons having the energy width of 1 eV at the highest are extracted among the secondary electrons having the above wide energy distribution, the secondary electrons is further reduced to several tens percentages.

As described above, even if the images are going to be formed at once by using the secondary electrons that are obtained by illuminating a large current to the specimen with the electron beams as an area beam, it is difficult to ensure the S/N ratio of the image because the ratio of electrons that can actually contribute to the image formation is low, as a result of which it is impossible to reduce the inspection time as much as can be expected. Even if the backscattered electrons are used for the image formation, only the amount of the backscattered electrons which is smaller than the illuminating beam current by two digits is obtained, and it is difficult to perform both of the high resolution and the high throughput as in the case of the secondary electrons.

The device that magnifies and projects the image of mirror electrons reflected immediately before the specimen without abutting against the specimen instead of the secondary electrons or the backscattered electrons is called "mirror electron microscope". The defect can be detected by detecting the disturbance of a potential or a configuration which is caused by the defect by means of the mirror electrons. In the case where the pattern is convexed or negatively charged, an equipotential surface formed immediately above the specimen acts as a convex lens with respect to the incident electrons. In the case where the pattern is concaved or relatively positively charged, the equipotential surface formed immediately above the specimen acts as a concave lens with respect to the incident electrons. As described above, the mirror electrons slightly change the trajectory due to the lens formed immediately above the specimen, but when the focal point conditions of the imaging lens are adjusted, most of those mirror electrons can be used for image formation. That is, the use of the mirror electrons makes it possible to obtain an image that is high in the S/N ratio and expect the reduction of the inspection time.

However, the image that is obtained from the mirror electrons reflects the equipotential surface immediately above the specimen and is greatly different from a general electron microscope. As a result, it is difficult to obtain information in correspondence with an accurate configuration and position of the specimen. Accordingly, it is essential to provide means for acquiring the accurate configuration and the positional information of the specimen in addition to a function of acquiring the image of the mirror electrons.

The device structure of the mirror electron microscope that magnifies and projects the mirror electrons for imaging is made up of an illuminating lens system that illuminates the electron beams onto the specimen, an imaging lens system that images the electrons reflected from the specimen, and a separator that separates the illuminating electron beams from the reflected electron beams. The same device structure is disclosed in the above-mentioned conventional examples of the low energy electron microscope that images the secondary electrons or the backscattered electrons (the above three Japanese Patent publications) is composed of the illuminating lens system, the imaging lens system, and the separator of an E×B deflector that forms the orthogonal electric field to the magnetic field.

However, the above-mentioned conventional examples have no device that can perform both of the mirror electron microscope and the low energy electron microscope, and the mirror electron and the secondary electron image cannot be observed in the same visual field. In the mirror electron microscope, an accelerating voltage $V_0$ that is applied to an electron source is set to be substantially the same potential as a specimen supply voltage $V_s$ with the results that the illuminating electron beam is reversed immediately above the specimen into a reflecting electron beam, and the reflecting electron beam is exitted from an objective lens with the same energy $eV_0$ as an energy $eV_0$ that is entered to the objective lens. On the other hand, in the low energy electron microscope, the voltage $V_0$ that is applied to the electron source is set to a negative voltage with respect to the specimen supply voltage $V_s$ with the results that the electron beam is illuminated to the specimen with an energy of $e(V_s-V_0)$. When it is assumed that the energy of the secondary electrons or the backscattered electrons which are exitted from the specimen is $eV_2$, the secondary electrons or the backscattered electrons enter a separator after having exitted from the objective lens with the energy of $(V_s+V_2)$. Accordingly, even if the specimen supply voltage $V_s$ is adjusted to meet the low energy electron microscope conditions from a mode for acquiring the specimen image by means of the mirror electron microscope, the energy of the reflecting electron beam that passes through the separator is changed. As a result, a deflection action occurs in the reflecting electron beam, and the magnified image is moved, thereby making it difficult to observe the secondary electron image.

The present invention has been made in view of the above problems, and therefore an object of the present invention is to provide an electron microscope that can perform both of a mirror electron microscope observation and a low energy electron microscope observation in the same visual field. Another object of the present invention is to provide an electron beam inspection system that can detect a defective portion of a pattern formed on a specimen with a high resolution and at a high speed by means of the electron microscope.

SUMMARY OF THE INVENTION

The above objects of the present invention have been achieved by the following manner.

The present invention applies an E×B deflector as a beam separator. The E×B deflector has a feature that an electron beam that enters from one direction of an optical axis goes straight whereas an electron beam that enters from an opposite direction of the optical axis is deflected. Hereinafter, the beam separator in the present invention will be described.

The E×B deflector operates such that an electric field and a magnetic field are made orthogonal to each other and also superimposed on one another. This operation will be described with reference to FIG. 2. A deflection angle $\theta_{E0}$ and a deflection angle $\theta_{M0}$ are represented by the following expressions (1) and (2), respectively. As shown in FIG. 2, the electron beam of the accelerating voltage $V_0$ is deflected by the deflection angle $\theta_{E0}$ by applying a voltage of $\pm V_D$ to an electrostatic deflector of a parallel plate electrode type with a length 2 1 and an interval d. Also, the electron beam is deflected by the deflection angle $\theta_{M0}$ by means of a uniform magnetic field deflector with a length 2 1 and a magnetic flux density B.

$$\theta_{E0} = \frac{l}{d}\frac{V_D}{V_0} = \alpha \frac{V_D}{V_0}, \alpha \equiv \frac{l}{d} \quad (1)$$

$$\theta_{M0} = l\sqrt{\frac{2e}{m}}\frac{B}{\sqrt{V_0}} = \beta\frac{B}{\sqrt{V_0}}, \beta \equiv l\sqrt{\frac{2e}{m}} \quad (2)$$

$$E = \frac{V_D}{d} = \sqrt{\frac{2e}{m}V_0}\,B \quad (3)$$

where the condition of the electric field intensity E and the magnetic flux density B within the deflector, under which the deflection caused by the electric field and the deflection caused by the magnetic field cancel each other is called "Wien condition". In FIG. 2, the electron beam that enters from above to the E×B deflector which is set to the Wien condition goes straight, and the electron beam enters from below is subjected to deflection of $\theta_{E0}+\theta_{M0}=2\theta_{E0}$.

In the mirror electron microscope, for example, the condition of a deflector under which the electric field and the magnetic field act in the same direction is used with respect to the illuminating electron beam, and the Wien condition under which the actions of the electric field and the magnetic field cancel each other, and the electron beam goes straight within the deflector is used with respect to the reflecting electron beam. The energy of the illuminating electron beam that is entered to the deflector and the energy of the mirror electron beam that becomes the reflecting electron beam and is entered to the deflector are equally $eV_0$. When it is assumed that the deflection angles of the electrostatic deflector and the magnetic field deflector with respect to the electron beam of the energy $eV_0$ are $\theta_{E0}+\theta_{M0}$, respectively, the deflection angle $\theta_{IN}$ with respect to the illuminating electron beam and the deflection angle $\theta_{OUT}$ with respect to the reflecting electron beam are represented by the following expression.

$$\theta_{IN}=\theta_{E0}+\theta_{M0}, \theta_{OUT}=\theta_{E0}-\theta_{M0}=0 \quad (4)$$

The deflection angle $\theta_{IN}$ of the illuminating system is an angle between an optical axis of the illuminating system and an optical axis of an imaging system, which is inherent to the apparatus.

On the other hand, in the low energy electron microscope, the energy of the illuminating electron beam that enters the deflector is $eV_0$, and the energy of the reflecting electron beam made up of the secondary electrons or the backscattered electrons which enters the deflector is $eV_1$. Likewise, in the energy condition, the operating condition that satisfies the Wien condition with respect to the reflecting electron beam, and satisfies $\theta_{IN}$ with respect to the incident electron beam is obtained in the following manner.

When it is assumed that the deflection angles of the electrostatic deflector and the magnetic field deflector with respect to the electron beam of the energy $eV_1$ are $\theta_{E1}$ and $\theta_{M1}$, respectively, the Wien condition, $\theta_{E1}=\theta_{M1}$ is met with respect to the reflecting electron beam. On the other hand, the following condition must be met with respect to the illuminating electron beam taking a variation in the accelerating voltage into consideration.

$$\theta_{IN} = \frac{V_1}{V_0}\theta_{E1} + \sqrt{\frac{V_1}{V_0}}\,\theta_{M1} = \sqrt{\frac{V_1}{V_0}}\left(1+\sqrt{\frac{V_1}{V_0}}\right)\theta_{E1} \quad (5)$$

The relationship between $\theta_{E0}$ and $\theta_{E1}$ is represented by the following expression because of $\theta_{IN}=2\theta_{E0}$ under the mirror electron microscope condition.

$$2\theta_{E0} = \sqrt{\frac{V_1}{V_0}}\left(1 + \sqrt{\frac{V_1}{V_0}}\right)\theta_{E1} \quad (6)$$

This expression is modified as follows: 1

$$\gamma = \frac{\theta_{E1}}{\theta_{E0}} = \frac{2}{\sqrt{\frac{V_1}{V_0}}\left(1 + \sqrt{\frac{V_1}{V_0}}\right)} = \sqrt{\frac{V_0}{V_1}}\frac{2}{1 + \sqrt{\frac{V_1}{V_0}}} \quad (7)$$

where when it is assumed that a specimen supply voltage is $V_s$, and an initial energy of the secondary electrons or the backscattered electrons is $V_2$, the energy $eV_1$ of the reflecting electron beam of the low energy electron microscope is represented by $eV_1=e(V_s+V_2)$. However, since the energy of the secondary electrons is generally several eV, that is, small, $eV_1=eV_s$ may be set in the case of the secondary electron imaging.

The deflection angle attributable to the electrostatic deflector is in proportion to the supply voltage of the deflector, and in the case where the magnetic flux density B of the magnetic field deflector is induced by a coil, the magnetic flux density B is in proportion to an exciting current that is allowed to flow in the coil. Accordingly, the changeover of the mode from the mirror electron microscope condition to the low energy electron microscope can be observed without escape of the image from the mirror electron image to the secondary electron image if a deflection voltage and a supply current which are obtained by multiplying the deflection voltage and the coil supply current of the E×B deflector by a value of γ that is denoted by Expression (7) are provided at the same time as the change over of the specimen supply voltage $V_s$.

According to the present invention, there can be realized an electron microscope that can perform both of the mirror electron microscope observation and the low energy electron microscope observation in the same visual field. Also, there can be realized an electron beam inspection system that can detect a defective portion of a pattern formed on a specimen with a high resolution and at a high speed by means of the electron microscope.

DETAILED DESCRIPTION OF THE PREFERRED EMBODIMENTS

Hereinafter, a description will be given in more detail of preferred embodiments of the present invention with reference to the accompanying drawings.

First Embodiment

Figure 1:
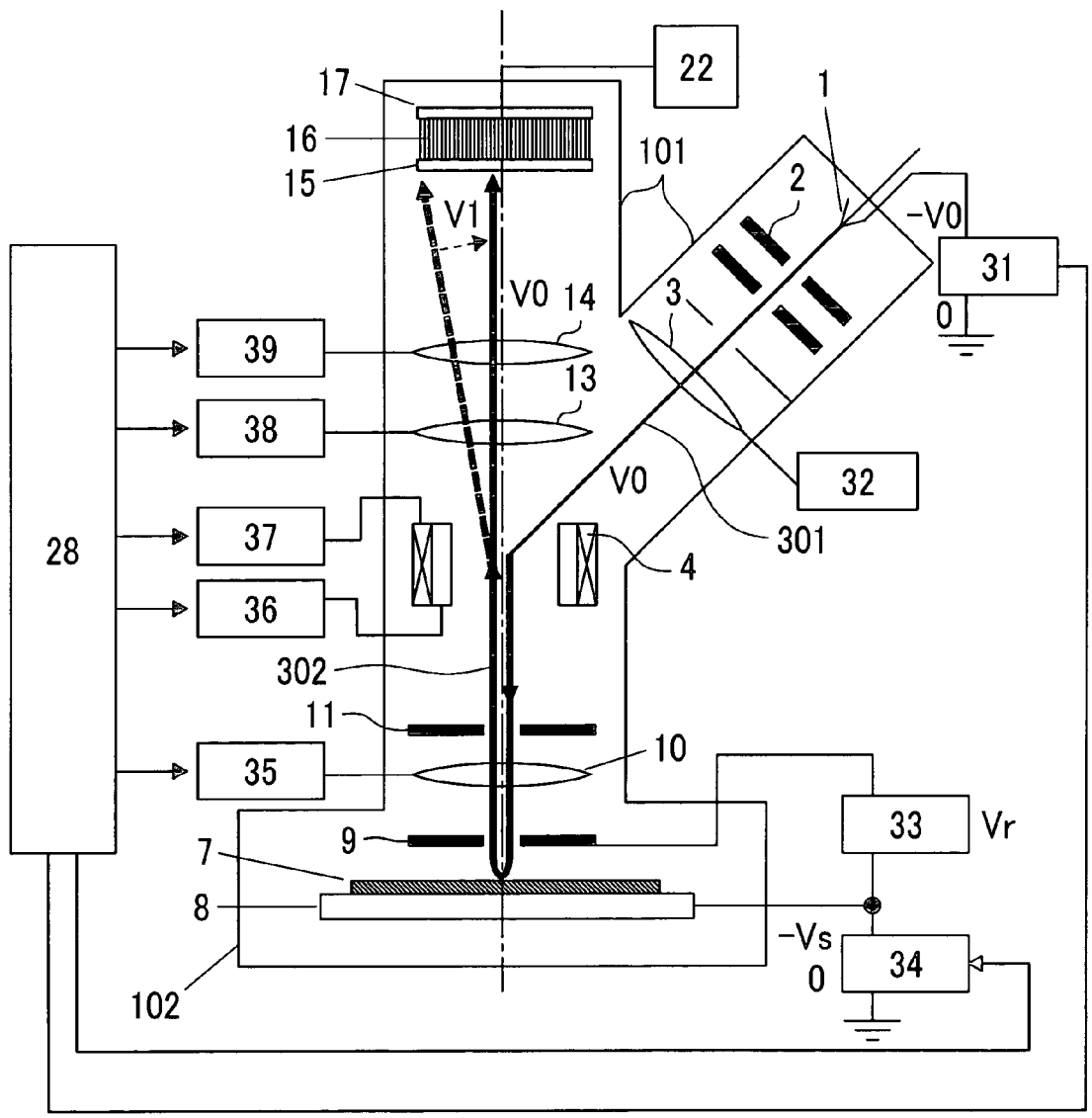
FIG. 1 is a diagram for explaining the structure of an electron microscope according to a first embodiment of the present invention.
Figure 2:
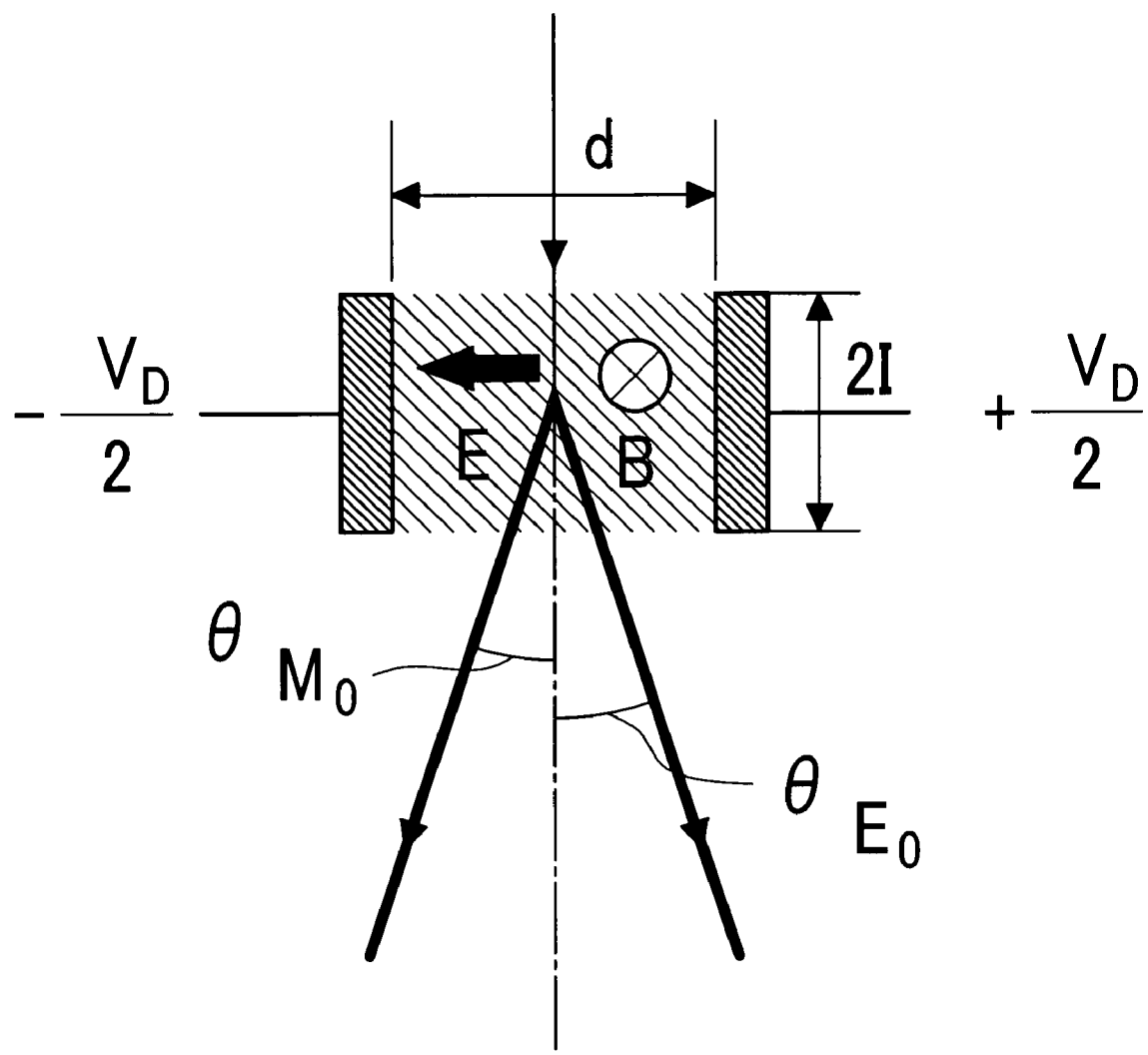
FIG. 2 is a diagram for explaining the operation of an E×B deflector as a beam separator according to the present invention.

FIG. 1 is a diagram for explaining the structure of an electron microscope according to a first embodiment of the present invention.

In an electron optical system 101, an E×B deflector 4 is disposed in the vicinity of an imaging plane of a reflecting electron beam 302 as a separator. An optical axis of the illuminating system and an optical axis of an imaging system which is perpendicular to a specimen (for example, wafer) 7 cross each other with an angle of $\theta_{IN}$. The E×B deflector 4 is disposed between a condenser lens 3 and an objective lens 10 as a beam separator. An illuminating electron beam 301 that is emitted from an electron source 1 is deflected to the optical axis which is perpendicular to the wafer 7 by means of the E×B deflector 4. The illuminating electron beam 301 that is deflected by the E×B deflector 4 is converged in the vicinity of the focal plane of the objective lens by means of the condenser lens 3, and the specimen 7 can be illuminated by the substantially parallel illuminating electron beams.

In a specimen chamber 102, a negative potential that is substantially equal to or slightly higher than an accelerating voltage $V_0$ which is applied to the electron source 1 is applied to the specimen 7 through a stage 8 that holds the specimen 7 by a specimen power supply 34. A positive voltage in a range of from several kV to several tens kV is applied to an aperture electrode 9 that faces the specimen by an aperture electrode power supply 33 with respect to the specimen 7. Most of the planar illuminating electron beam 301 is pulled back by a decelerating electric field between the aperture electrode 9 and the specimen 7 immediately before colliding with the specimen 7 to provide the mirror electrons. The mirror electrons have a direction and an intensity which reflect the configuration or the potential of the specimen 7 or the magnetic field, and are again inputted to the objective lens 10.

The reflecting electron beam 302 caused by the mirror electrons is magnified by the objective lens 10, and then forms a mirror projection image in the vicinity of the E×B deflector 4. The E×B deflector 4 operates the reflecting electron beam under the Wien condition. That is, since the E×B deflector 4 has no deflecting action with respect to the reflecting electron beam 302, and the mirror image is formed and projected in the vicinity of the E×B deflector 4, a deflection aberration caused by the E×B deflector 4 hardly occurs. The mirror image produced by the objective lens 10 is projected by an intermediate lens 13 and a projection lens 14, and the mirror electron image magnified on a scintillator 15 is formed. The mirror electron image is converted into an optical image by means of the scintillator 15, and then projected onto a CCD camera 17 by an optical lens 16 or an optical fiber bundle 16. The mirror image that has been converted into an electric signal by the CCD camera 17 is displayed on a monitor 22.

Figure 3:
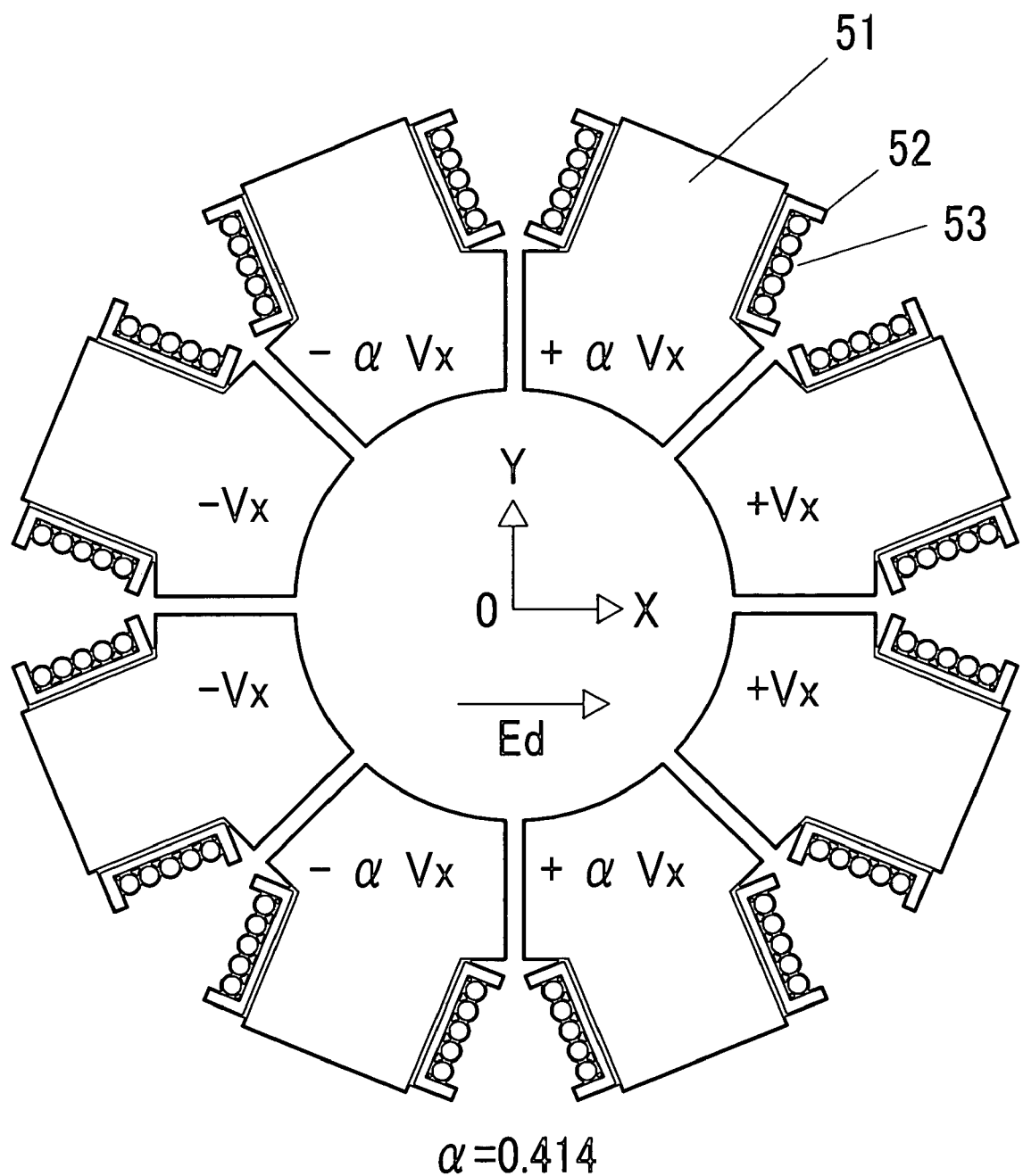
FIG. 3 is a diagram for explaining a voltage distribution in an 8-pole E×B deflector.

FIG. 3 is a cross-sectional view showing the E×B deflector 4 viewed from a direction perpendicular to the optical axis. This example shows an 8-pole electromagnetic electrode structure. Each of electromagnetic electrodes 51 is formed of magnetic material such as permalloy. Each of the electromagnetic electrodes acts as an electrode by applying a potential, and acts as a magnetic electrode by making an exciting current flow in a coil 53 that is winded on a bobbin 52 of each of the electromagnetic electrodes 51 by N rounds. When a voltage $V_x$ is applied to each of the electromagnetic electrodes by a voltage distribution shown in FIG. 3, the electrons are subjected to a deflecting action in an x-direction.

Figure 4:
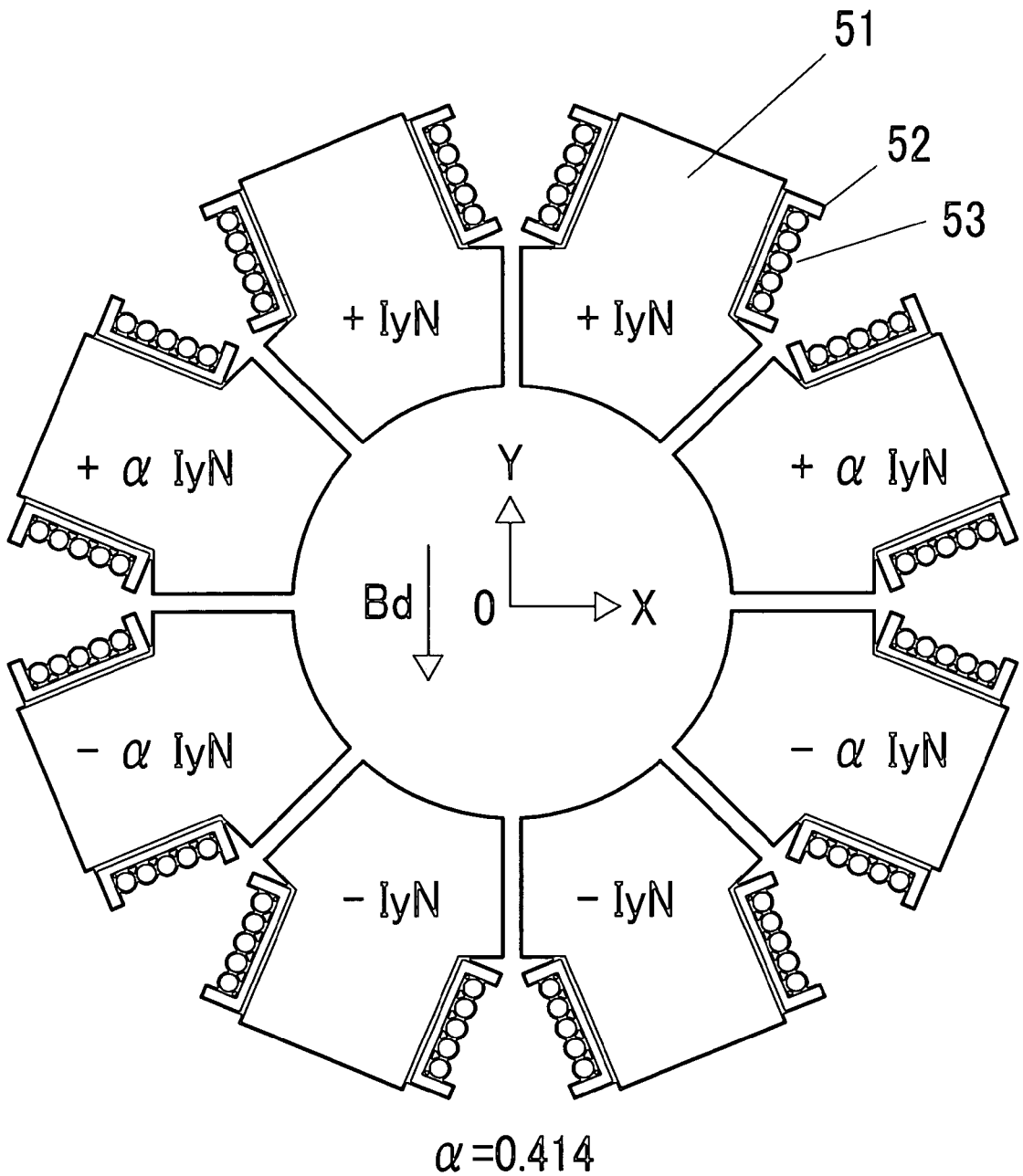
FIG. 4 is a diagram for explaining a current distribution in the 8-pole E×B deflector.

Also, when a current $I_Y$ is allowed to flow into each of the coils by a current distribution shown in FIG. 4, the electrons that move from a rear side of a paper surface of FIG. 3 toward a front side thereof is subjected to the deflecting action in a positive x-direction. Also, the electrons that move from the front side of the paper surface toward the rear side thereof are subjected to the deflecting action in a negative x-direction. The voltage and current distributions of each of the electrodes are optimized such that a uniform electromagnetic field is developed due to an electromagnetic field calculation that gives a potential or a magnetic potential to an actual electromagnetic electrode configuration. For example, a constant α in the figure is set to 0.414.

Figure 5:
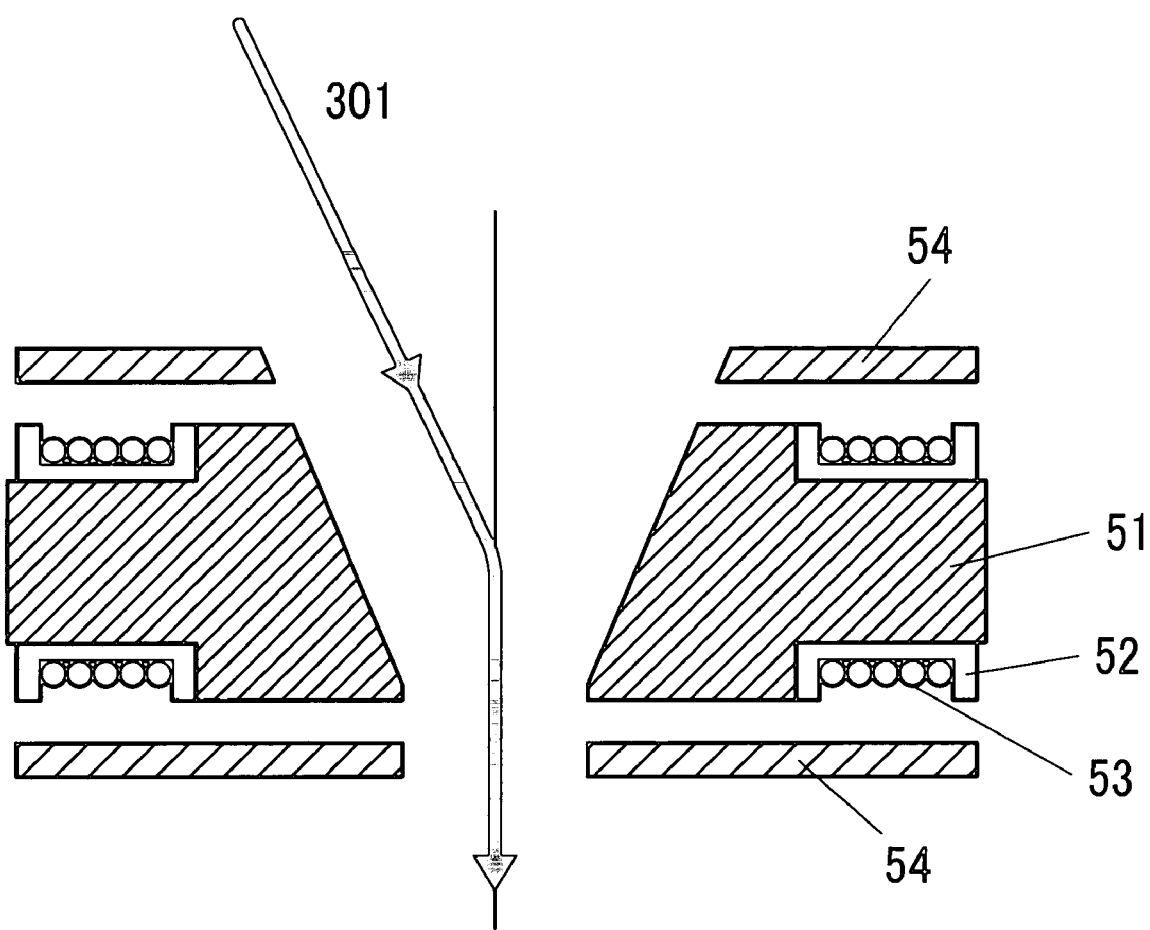
FIG. 5 is a cross-sectional view showing the 8-pole E×B deflector.

FIG. 5 is a cross-sectional view including an optical axis of the E×B deflector 4. In the case where the E×B deflector is used as a beam separator, a cross angle EIN of the illuminating system and the imaging system needs to take about 30 degrees taking an arrangement relationship in which those two optical systems do not interfere with each other into consideration. In order that the illuminating electron beam 301 is prevented from illuminating the electromagnetic electrode even if an illuminating electron beam 301 is deflected by 30°, a diameter of an opening portion must be made larger than the length of the electromagnetic electrode. However, since the voltage to be deflected must be increased when the opening is widened, the configuration of the electromagnetic electrode 51 is conically shaped so as to be widened toward the end substantially along the electron locus. Also, shield electromagnetic electrodes 54 are disposed on the upper and lower sides of the electromagnetic electrode, and operate as a complete E×B deflector that always meets the Wien condition within a space by suppressing oozing of the electromagnetic field and operating the electric field and the magnetic field in the same space.

Subsequently, a procedure of adjusting the illuminating electron beam 301 using the E×B deflector 4 well be described. Under the condition where the accelerating voltage $V_0$ is constant, since the ratio of the electromagnetic electrode supply voltage $V_x$ and the electromagnetic electrode supply current $I_Y$ which meets the Wien condition is constant, the relationship between $V_0$ and the intensity ratio is obtained in advance by using a manner such as computer simulation, and then stored in a controller 28. When the accelerating voltage $V_0$ is inputted to the controller 28, the controller 28 applies $V_0$ to the electron source 1 from the electron source power supply 31, and also conducts control so as to keep the intensity ratio of the voltage $V_x$ that is applied to the electromagnetic electrode from a voltage power supply of the E×B deflector 36 and the current $I_Y$ that is supplied to the electromagnetic electrode from a current power supply of the E×B deflector 37 constant. The intensity ratio of $V_X$ and $I_Y$ are increased manually or automatically while being kept constant, and the specimen 7 is set to an earth potential and an ammeter is connected to the specimen 7, and the illuminating electron beam of the accelerating voltage $V_0$ is illuminated onto the specimen 7, and the absorbed current is measured, thereby making it possible to obtain a condition under which the illuminating electron beam reaches the specimen 7, that is, the deflection angle $\theta_{IN}$ produced by the E×B deflector 4 of the illuminating electron beam.

Subsequently, the controller 28 sets the voltage that is applied to the specimen 7 from the specimen power supply 34 through the stage 8 which holds the specimen to a negative voltage that is substantially equal to or slightly higher than the accelerating voltage $V_0$ of the electron beam. As a result, the direction of the illuminating electron beam is changed immediately above the specimen 7, and meets a condition that produces the mirror electron beam. When the E×B deflector 4 meets the complete Wien condition with respect to the reflecting electron beam caused by the mirror electrons, the reflecting electron beam goes straight within the E×B deflector 4, and is then detected by the CCD camera 17 or detecting means such as a Faraday cup located on the imaging system optical path. When the reflecting electron beam is not detected, the controller 28 conducts control so as to change the ratio of the voltage $V_X$ and the current $I_Y$ while keeping the deflection angle $\theta_{IN}$ of the illuminating electron beam by the E×B deflector 4 constant. The controller 28 conducts control so that an increment ΔV of the voltage and an increment ΔI of the current satisfy the following relationship:

$$\frac{\Delta V}{V_X} = -\varepsilon \frac{\Delta I}{I_Y} \tag{8}$$

where ε is almost 1. The condition under which the reflecting electron beam goes straight through the E×B deflector 4 and reaches the CCD camera 17 is determined by controlling the ratio of the voltage and the current. With the above adjustment, the control voltage $V_X$ and the control current $I_Y$ of the E×B deflector 4 under the mirror electron microscope condition are determined.

Subsequently, a procedure of changing over from the mirror electron microscope mode to the low energy electron microscope mode will be described. The specimen supply voltage $-V_S$ that is applied to the specimen 7 from the specimen voltage power supply 33 through the stage 8 is set at the positive voltage side of the electron source supply voltage $-V_0$ that is applied to the electron source 1 from the electron source power supply 31. As a result, the illuminating electron beam illuminates the specimen 7 with an energy of $e(V_0-V_s)$. The secondary electrons that have been emitted from the specimen 7 of the potential $-V_s$ are accelerated in a zone between the specimen 7 and the aperture electrode 9 that faces the specimen 7. Then, the secondary electrons are inputted to the imaging system with the energy of $eV_1$ after having passed through a final electrode of the objective lens 11 which has the earth potential. In this example, when it is assumed that the initial energy of the secondary electrons is $V_2$, $V_1=V_S+V_2$ is satisfied. $V_s$ is normally set to about several kV to several tens kV whereas $V_2$ is several V at the highest. Accordingly, the above expression can be approximated by $V_1=V_s$.

The $\gamma V_x$ and $\gamma I_Y$ are calculated by multiplying the electromagnetic electrode supply voltage $V_x$ and the electromagnetic electrode supply current $I_Y$ of the E×B deflector 4 by γ represented by Expression (7), respectively, in the controller 28. Then, the voltage of $\gamma V_x$ and the current of $\gamma I_Y$ are supplied to each of the electromagnetic electrodes of the E×B deflector 4 through the voltage power supply of the E×B deflector 36 and the current power supply of the E×B deflector 37. Similarly, the energy of the reflecting electron beam changes from $eV_0$ to $eV_1$ in the objective lens 10, the intermediate lens 13 and the projection lens 14. Therefore, in the case of the magnetic field lens, when it is assumed that the number of winding of the magnetic field coil is N, the exciting current of the accelerating voltage $V_0$ is $I_0$, and the exciting current of the accelerating voltage $V_1$ is $I_1$, the exciting current $I_1$ that is supplied to the objective lens 10, the intermediate lens 13 and the projection lens 14 from an objective lens power supply 35, an intermediate lens power supply 38, and a projection lens power supply 39, respectively, is multiplied by $\sqrt{V_1}/\sqrt{V_0}$ so that the lens excitation $E_x$ is kept constant as follows:

$$E_X \equiv \frac{I_0 N}{\sqrt{V_0}} = \frac{I_1 N}{\sqrt{V_1}} \qquad (9)$$

In the case where the electron lens is an electrostatic lens, such a supply voltage value that the focal length becomes equal with respect to a change in the accelerating voltage through numerical calculation is stored in the controller 28 in advance, and is then set in the respective electrostatic lenses from the controller 28. Also, the accelerating voltage is corrected in the deflector 6 within the imaging system in the same procedure.

Through the above operation, even if the accelerating voltage of the reflecting electron beam is changed, the Wien condition of the E×B deflector 4 with respect to the reflecting electron beam is kept while the focal length of the imaging lens can be kept constant. Therefore, it is possible to observe the same visual field by the same magnification even when the mode changes over from the mirror electron microscope mode to the low energy electron microscope mode.

The above operation was described in the x-deflecting direction of the E×B deflector 4. The same procedure can be applied to the correction of the deflection component in the y-direction by supplying the voltage or current of the deflection component in the y-direction to the 8-pole electromagnetic electrodes. For example, in the case where the magnetic flux is leaked in the E×B deflector from the surrounding magnetic field lens, it is necessary to conduct rotation correction for superimposing the electromagnetic field in the y-direction.

Also, in FIG. 4, the number of winding in each of the coils is equal to each other and set to N. However, the current I and N may be changed within the limit that a relationship NI of N and the current I that flows in the magnetic electrode is kept constant.

Second Embodiment

Figure 6:
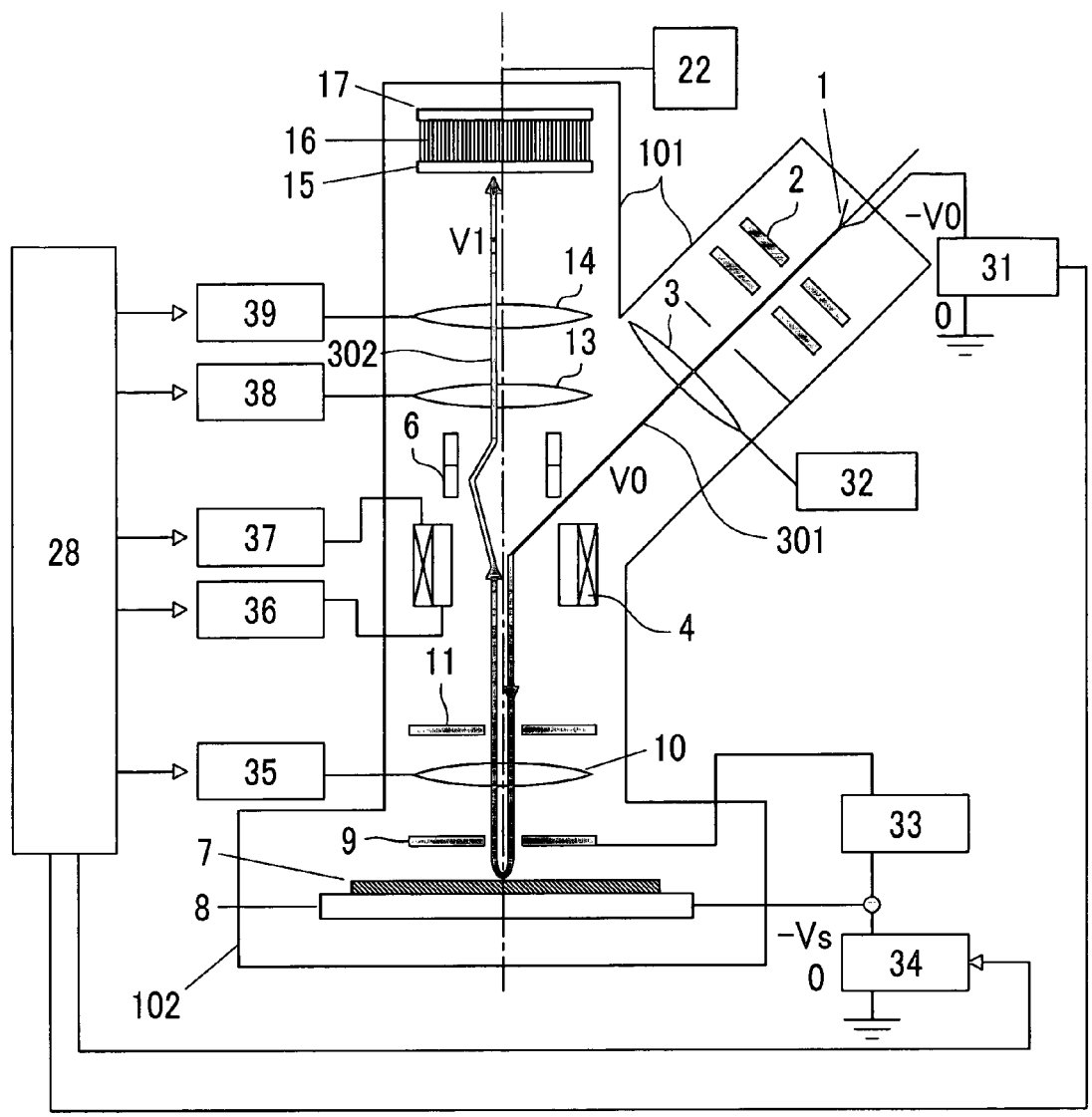
FIG. 6 is a diagram for explaining the structure of an electron microscope according to a second embodiment of the present invention.

A second embodiment of the present invention shown in FIG. 6 is structured in such a manner that the deflector of the imaging system 6 is disposed in the rear of the image system E×B deflector 4.

In the mirror electron microscope observation mode, the condition of the E×B deflector 4 where the electric field and the magnetic field operate in the same direction is used with respect to the illuminating electron beam, and the Wien condition where the electron beam goes straight within the E×B deflector 4 while the actions of the electric field and the magnetic field cancel each other is used with respect to the reflecting electron beam. The energy of the illuminating electron beam that is inputted to the E×B deflector 4 and the energy of the reflecting electron beam that is inputted to the E×B deflector 4 are equally $eV_0$.

On the other hand, in the low energy electron microscope observation mode, the energy of the illuminating electron beam that is inputted to the E×B deflector 4 is $eV_0$, and the energy of the reflecting electron beam that is made up of the secondary electrons or the backscattered electrons and is inputted to the E×B deflector 4 are $eV_1$. Accordingly, when the E×B deflector 4 is operated with the same intensity, the deflection angle $\theta_{OUT}$ of the reflecting electron beam of the energy $eV_1$ is represented by the following expression, assuming that a deflection angle of the electrostatic deflector with respect to the electron beam of the energy $eV_0$ is $\theta_{E0}$.

$$\theta_{OUT} = \frac{V_0}{V_1}\theta_{E0} - \sqrt{\frac{V_0}{V_1}}\theta_{E0} \qquad (10)$$

In the deflection angle of the reflecting electron beam, by operating the deflector 6 so that the deflection angle caused by the deflector 6 that is located in the rear of the imaging system E×B deflector 4 has an intensity of $-\theta_{OUT}$, the deflecting direction can be returned to the original. In addition, if two deflectors are used as the deflector 6, when the deflectors operate so that $\theta_{D1}=\theta_{D2}+\theta_{OUT}$ is satisfied by the deflection angle $\theta_{D1}$ of a first deflector and the deflection angle $\theta_{D2}$ of a second deflector, the deflecting direction of the reflecting electron beam and the deviation from the optical axis can be almost returned to the original.

Third Embodiment

Figure 7:
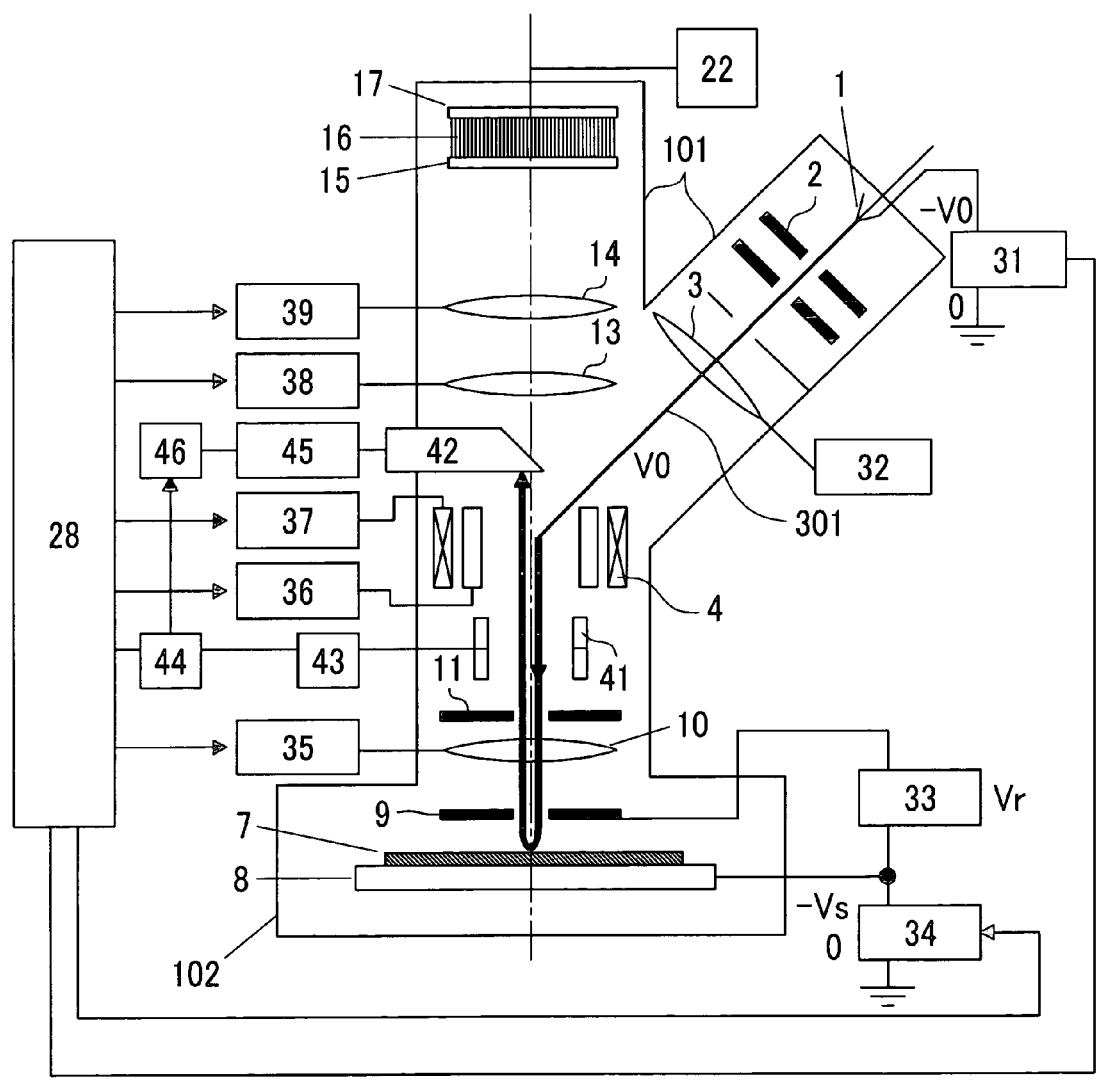
FIG. 7 is a diagram for explaining the structure of an electron microscope according to a third embodiment of the present invention.

A third embodiment of the present invention shown in FIG. 7 is so structured as to perform both of the mirror electron microscope observation and the scanning electron microscope observation.

In the changeover of the mode from the mirror electron microscope mode to the mirror scanning electron microscope mode, the imaging condition of the condenser lens 3 is changed over through the condenser power supply 32 from the controller 28 with the result that the condition under which the surface beam illuminates the specimen is changed to the condition under which the spot beam illuminates the specimen. More specifically, the imaging position of the condenser lens 3 is made to substantially coincide with the imaging position of the reflecting electron beam from the focal plane position of the objective lens 10. At the same time, a scanning deflector 41 is driven through a deflection signal generator 44 and a deflection amplifier 43, and the specimen is scanned with the illuminating electron beam. Also, a secondary electron detector 42 that detects the mirror electrons or the secondary electrons which rebound from the specimen 7 is inserted into an imaging system optical path to detect the mirror electrodes or the secondary electrons. The detected electrons are amplified by a signal amplifier 45. An amplified image signal is supplied to a display device 46 into a luminance modulation signal. A deflection signal that is synchronous with the beam scanning is supplied to the display device 46 from the deflection signal generator 44, and a mirror electron image produced in the scanning microscope mode is formed on the display device 46.

In the change over of the mirror electron image observation to the secondary electron image observation, the specimen supply voltage $-V_S$ that is applied to the specimen 7 from the specimen voltage power supply 33 through the stage 8 is set at the positive voltage side of the electron source supply voltage $-V_0$. As a result, the illuminating electron beam illuminates the specimen 7 with an energy of $e(V_0-V_s)$. At the same time, the condenser lens 3 is so controlled as to adjust the electron beam that illuminates the specimen in the form of spots. The secondary electrons or the backscattered electrons which have been obtained by making the electron beam illuminate the specimen 7 are detected by the secondary electron detector 42, to thereby obtain the secondary electron scanning image in the scanning electron microscope mode.

Fourth Embodiment

Figure 8:
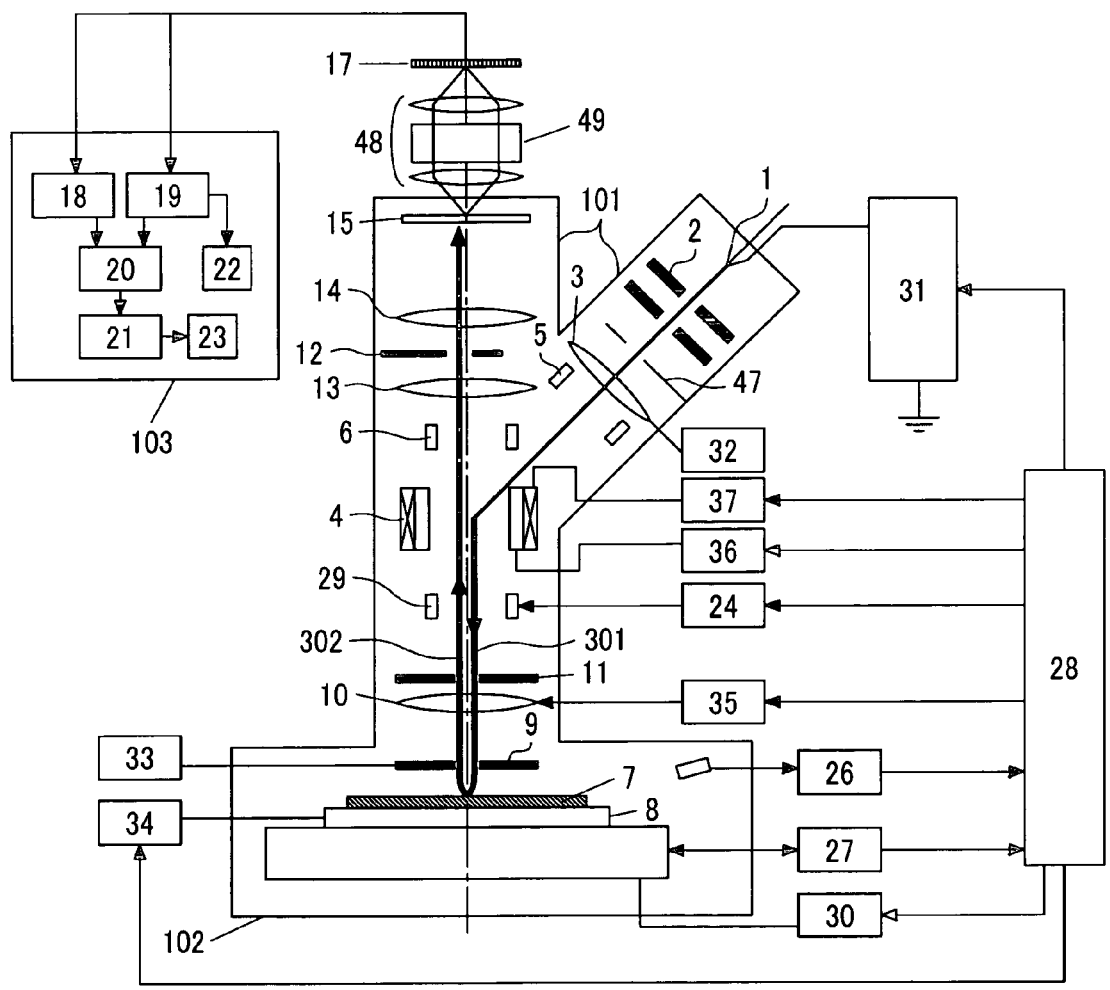
FIG. 8 is a diagram for explaining the structure of an electron microscope according to a fourth embodiment of the present invention.

A fourth embodiment of the present invention shown in FIG. 8 is so structured as to apply the mirror electron microscope to a high-speed wafer inspection.

The illuminating electron beam 301 that is emitted from the electron source 1 is conversed by the condenser lens 3, and illuminates the specimen substantially in parallel. As the electron source 1, there is used a Schottky electron source of the Zr/O/W type which is about 1 µm in the radius of the leading edge. With the use of that electron source, a uniform planar electron beam which is a large current beam (for example, 1.5 µA) and 0.5 eV or lower in the energy width can be stably formed.

The E×B deflector 4 as a separator is disposed in the vicinity of the imaging plane of the reflecting electron beam 302. The illuminating electron beam 301 is deflected to the optical axis perpendicular to the wafer 7 by means of the E×B deflector 4. The E×B deflector 4 has the deflecting action only with respect to the electron beam from above. The electron beam that has been deflected by the E×B deflector 4 forms a planar electron beam in a direction perpendicular to the surface of the specimen (wafer) by the objective lens 10.

The mirror electron microscope mode is used in the defect inspection. The locus of the mirror electrons is changes due to the distortion of an equipotential surface that is formed immediately above the specimen. However, most of those mirror electrons can be used for image formation by adjusting the condition for the focal point of the imaging lens. That is, the use of the mirror electrons enables an image high in the S/N ratio to be obtained, and a reduction in the inspection time can be expected.

When a user sets the mode to the mirror electron microscope mode, a negative potential that is substantially equal to or slightly higher than an accelerating voltage of the electron beam is applied to the specimen 7 by the specimen power supply 33. An electric field that reflects the formed semiconductor pattern configuration or the charging state is formed on the surface of the specimen 7. Most of the planar illuminating electron beam is pulled back by that electric field immediately before colliding with the specimen 7 to provide the mirror electrons. The mirror electrons have a direction and an intensity which reflect the pattern information of the specimen 7 as the mirror electrons.

The mirror electrons are subjected to convergence by the objective lens 10. The E×B deflector 4 as the beam separator is so set as not to provide the deflection with respect to the reflecting electron beam that is advanced from below. The reflecting electron beam goes up perpendicularly as it is, and is then magnified and projected by the intermediate lens 13, the projection lens 14 to form an image of the surface of the wafer 7 on the image detecting portion including the CCD camera 17. As a result, a local change in the charge potential on the surface of the specimen 7 and a difference in the structure such as roughness are formed as the image. The image is converted into an electric signal and then transmitted to an image processing system 103.

The image processing system 103 is made up of image signal memories 18, 19, a calculator 20, and a defect determination unit 21. The image memories 18 and 19 store the images of the adjacent portions of the same pattern, and both of those images are calculated by the calculator 20 to detect different locations of those images. This result is determined as a defect by the defect determination unit 21, and its coordinates are stored in the memory 23. The taken image signal is displayed on the monitor 22 as an image.

In the case where the patterns of adjacent chips A and B having the same design pattern formed on a semiconductor wafer surface which is the specimen are compared and inspected, an electron beam image signal in an area to be inspected within the chip A is taken and then stored in the memory 18. Then, an image signal in an area to be inspected corresponding to the above area within the adjacent chip B is taken and then stored within the memory 19. At the same time, the image signal is compared with the image signal stored in the memory 18. In addition, an image signal in a corresponding area to be inspected within a subsequent chip C is acquired and then overwritten and stored in the memory 18. At the same time, the image signal is compared with the stored image signal related to the area to be inspected within the chip B in the memory 19. The above operation is repeated, and the image signals in the areas to be inspected which correspond to each other within all of the chips to be inspected are sequentially stored, and compared with each other.

Apart from the above method, it is possible to apply a method in which an electron beam image signal of a desired inspection area in a good (no defect) specimen which becomes standard is stored in the memory 18 in advance. In this case, the inspection area and the inspection condition related to the above good specimen are inputted to the controller 28 in advance, the inspection of the above good specimen is executed on the basis of those input data, and the acquired image signal related to the desired inspection area is stored in the memory 18. Then, the wafer 7 to be inspected is loaded on the stage 8, and the inspection is executed in the same procedure as the above.

Subsequently, the acquired image signal related to the area to be inspected which corresponds to the above area is taken within the memory 19. At the same time, the image signal related to the specimen to be inspected is compared with the image signal related to the above good specimen that has been stored in the memory 18 in advance. As a result, the presence or absence of the pattern defect on the desired inspection area of the specimen to be inspected is detected. As the standard (good) specimen, there may be used a wafer that is known to have no pattern defect other than the above specimen to be inspected in advance, or there may be used an area (chip) that is known to have no pattern defect on the specimen surface to be inspected in advance. For example, when a pattern is formed on the surface of a semiconductor specimen (wafer), a failure to put a lower pattern and an upper pattern together may occur over the entire wafer surface. In this case, when the patterns within the same wafer or within the same chip are to be compared with each other, a fault (defect) that occurs over the entire wafer surface may be overlooked.

However, according to this embodiment, the image signal related to the area which is known to be good (not defective) in advance is stored in advance, and the stored image signal and the image signal related to the area to be inspected are compared with each other. As a result, the fault that occurs over the entire wafer surface as described above can be detected with high precision.

Both of the image signals that have been stored in the memories 18 and 19 are taken into the calculator 20, respectively. In the calculator 20, various statistics (more specifically, the statistics of the average values of image densities or dispersions), or a difference value between the peripheral pixels is calculated on the basis of a defect determination condition that has been already obtained. Both of those image signals that have been subjected to those processing are transferred to the defect determination unit 21. In the defect determination unit 21, those image signals are compared with each other, and a difference signal between both of the image signals is extracted. The difference signal is compared with the defect determination condition that has been already obtained and stored to determine the defect. The image signal related to the pattern area that has been determined as the defect is sorted from the image signals related to other areas, and an address of the defective portion is stored in the memory 23.

The operation commands and the operation conditions of the respective units of the device are inputted or outputted from the controller 28. The controller 28 is inputted with various conditions such as the accelerating voltage at the time of generating the electron beam, the electron beam deflection width/deflection speed, the specimen stage travel speed, or a timing at which the image signals are taken in from the image detecting device in advance. The controller 28 generates a correction signal on the basis of signals from a stage position measuring device 27 and a height measuring device 26. The correction signal is transmitted to an objective lens power supply 35 or a deflector power supply 24 that is supplied to the deflector 29 so that the electron beam always illuminates an accurate position. Upon receiving a command from the controller 28, a stage controller 30 controls a specimen travel stage 8.

In the inspection, the stage 8 on which the specimen (semiconductor wafer) 7 is mounted continuously travels at a constant speed in the x-direction. Since the stage 8 continuously travels, the electron beam is deflected and scanned by the illuminating system deflector 5 while following the travel of the stage 8.

The electron beam illuminated area or illuminated position is always monitored by the stage position measuring device 27 and the height measuring device 26 which are disposed on the stage 8. Those monitor information is transferred to the controller 28. The controller 28 grasps the amount of positional displacement in detail, and corrects the positional displacement with precision. As a result, the accurate positioning necessary for comparison and inspection of the patterns can be performed at a high speed and with a high precision.

Also, the height of the surface of the semiconductor wafer 7 is measured by means other than the electron beam at a real time, and the focal lengths of the objective lens 10, the intermediate lens 13 and the projection lens 14 for illumination of the electron beam are dynamically corrected. As means other than the electron beam, there is, for example, the height measuring device 26 of the optical system using a laser interference system or a system of measuring a positional change of the reflecting beam. As a result, the electron beam image that has been always focused on the surface of the area to be inspected can be formed. Also, it is possible that the distortion of the wafer 7 is measured before inspection in advance, and the above focal length is corrected on the basis of the measured data so as to make it unnecessary to measure the height of the surface of the wafer 7 at the time of the actual inspection.

Also, it is possible to use the low energy electron microscope mode for the above inspection. For example, in the configuration defect that occurs on the bottom portion of a line & space pattern, the detection efficiency may be higher in the case of detecting the secondary electrons obtained by making the electron beam high in the energy illuminate the specimen. When the user selects the low energy electron microscope mode, the specimen supply voltage $-V_s$ that is applied to the specimen 7 from the specimen voltage power supply 33 is set at the positive voltage side of the electron source supply voltage $-V_0$. As a result, the illuminating electron beam illuminates the specimen 7 with an energy of $e(V_0-V_s)$. The secondary electrons that are emitted from the specimen 7 of the potential $-V_s$ are accelerated in a zone between the specimen 7 and the aperture electrode 9 that faces the specimen 7, and then inputted to the imaging system with an energy of $eV_1$ after having passed through the final electrode of the objective lens 11 which is the earth potential. In this example, when it is assumed that the initial energy of the secondary electrons is $V_2$, $V_1=V_s+V_2$ is satisfied. $V_s$ is normally set to about several kV to several tens kV whereas $V_2$ is several V at the highest. Accordingly, the above expression can be approximated by $V_1=V_s$. The control voltage $V_x$ and the control current $I_y$ of the E×B deflector 4 are newly set with $\gamma V_x$ and $\gamma I_y$ represented by Expression (7), and then supplied.

In the objective lens 10, the intermediate lens 13 and the projection lens 14, the energy of the reflecting electron beam changes from $eV_0$ to $eV_1$. In the case of the magnetic field lens, when it is assumed that the number of winding of the magnetic field coil is N, the exciting current of the accelerating voltage $V_0$ is $I_0$, and the exciting current of the accelerating voltage $V_1$ is $I_1$, the exciting current $I_1$ is controlled so that the lens excitation Ex is kept constant as follows:

$$E_X \equiv \frac{I_0 N}{\sqrt{V_0}} = \frac{I_1 N}{\sqrt{V_1}} \quad (11)$$

In the case where the electron lens is an electrostatic lens, such intensity that the focal length becomes equal with respect to a change in the accelerating voltage through numerical calculation is set to the lens in advance. Also, the accelerating voltage is corrected in the deflector 6 within the imaging system in the same procedure.

In addition, in the low energy electron microscope mode, an aperture 12 that restricts the scattering direction of the secondary electrons or the backscattered electrons is disposed on the focal plane of the objective lens or on the imaging plane on which the focal plane of the objective lens is projected by the intermediate lens, thereby making it possible to obtain the high resolution image which is small in the lens aberration. Also, the secondary electrons or the backscattered electrons are greatly attenuated in the intensity after having passed through the aperture 12. Therefore, a multi-channel plate that doubles the secondary electrons or the backscattered electrons is disposed in front of a scintillator 15, or an image intensifier 49 that doubles the scintillator optical intensity is disposed in the rear of the scintillator 15, thereby making it possible to increase the signal intensity that is detected by the CCD camera 17. In this embodiment, the image intentifier 49 is disposed within the optical lens 48 optical path, and the amplification factor of the image intensifier 49 is increased at the time of selecting the low energy electron microscope mode, thereby obtaining a bright image. Alternatively, it is possible to insert the image intensifier 49 at the time of selecting the low energy electron microscope mode.

After the automatic defect inspection has been conducted in the mirror electron microscope mode or in the low energy electron microscope mode, the kind of defect is identified by observing the defective portion in detail. In the case of observing the defective portion in the low energy electron microscope mode, since the image that faithfully reflects the configuration of the specimen is obtained, the accurate size or configuration of the defect can be determined. On the other hand, in the mirror electron microscope mode, it is possible to observe the information on the potential distribution of the specimen surface in detail. Since the user can change over between the low energy electron microscope mode and the mirror electron microscope mode in the same visual field at the time of observing the specimen, it is possible to determine the kind of defect with precision.

As was described above, according to the present invention, there can be realized an electron microscope that can perform both of the mirror electron microscope observation and the low energy electron microscope observation in the same visual field. Also, there can be realized an electron beam inspection system that can detect a defective portion of a pattern formed on a specimen with a high resolution and at a high speed by means of the electron microscope.

What is claimed is:

1. An electron microscope, comprising:
   an illuminating lens system that illuminates an electron beam that is emitted from an electron source onto a specimen as a planar illuminating electron beam having a two-dimensional spread;
   an imaging lens system that projects and magnifies the reflecting electron beam emitted from the specimen to project and form a specimen image;
   a beam separator that separates the illuminating electron beam from reflecting electron beam;
   control means for controlling the reflecting electron beam so as to go straight through the beam separator, and the illuminating electron beam so as to keep a deflection angle of the illuminating electron beam which is made by the beam separator substantially constant;
   wherein the beam separator is formed of an E×B deflector that makes an electric field and a magnetic field orthogonal to each other and superimposed on one another, and the control means controls a voltage and a current which are supplied to the E×B deflector so that a Wien condition by which the deflections caused by the electric field and the magnetic field cancel each other is met with respect to the reflecting electron beam while keeping the deflection angle with respect to the illuminating electron beam substantially constant;
   a mirror electron microscope mode that magnifies and projects the mirror electron beam, and a low energy electron microscope mode that magnifies and projects the secondary electron beam or the backscattered electron beam; and
   means for changing over the mirror electron microscope mode and the low energy electron microscope mode;
   wherein the changeover from the mirror electron microscope mode to the low energy electron microscope mode is conducted by supplying a deflection voltage and a supply current which are obtained by multiplying a deflection voltage and a supply current of the E×B deflector by a value of γ that is represented by the following expression $$\gamma = \sqrt{\frac{V_0}{V_1} \frac{2}{1 + \sqrt{\frac{V_1}{V_0}}}}$$

at the same time as the changeover of the specimen supply voltage when it is assumed that an energy of the electron beam that is supplied to the E×B deflector is $eV_0$, and an energy of the outgoing electron beam that is supplied to the E×B deflector in the low energy electron microscope mode is $eV_1$.

2. An electron microscope, comprising:
   electron source voltage applying means for applying an accelerating voltage to an electron source;
   specimen voltage applying means for applying a specimen supply voltage to a stage that supports a specimen;
   an illuminating lens system that illuminates an electron beam that is emitted from the electron source onto a specimen as a planar illuminating electron beam having a two-dimensional spread;
   an imaging lens system that projects and magnifies the reflecting electron beam emitted from the specimen to project and form a specimen image;
   a beam separator that separates the illuminating electron beam from the reflecting electron beam;
   means for changing over the reflecting electron beam to mirror electrons that is returned back in the vicinity of the surface of the specimen without colliding with the specimen, and secondary electrons that are generated from the specimen or backscattered electrons;
   control means for controlling the reflecting electron beam so as to go straight through the beam separator, and the illuminating electron beam so as to keep a deflection angle of the illuminating electron beam which is made by the beam separator substantially constant;
   wherein the beam separator is formed of an E×B deflector that makes an electric field and a magnetic field orthogonal to each other and superimposed on one another, and the control means controls a voltage and a current which are supplied to the E×B deflector so that a Wien condition by which the deflections caused by the electric field and the magnetic field cancel each other is met with respect to the reflecting electron beam while keeping the deflection angle with respect to the illuminating electron beam substantially constant;
   a mirror electron microscope mode that magnifies and projects the mirror electron beam, and a low energy electron microscope mode that magnifies and projects the secondary electron beam or the backscattered electron beam; and
   means for changing over the mirror electron microscope mode and the low energy electron microscope mode;
   wherein the changeover from the mirror electron microscope mode to the low energy electron microscope mode is conducted by supplying a deflection voltage and a supply current which are obtained by multiplying a deflection voltage and a supply current of the E×B deflector by a value of γ that is represented by the following expression $$\gamma = \sqrt{\frac{V_0}{V_1} \frac{2}{1 + \sqrt{\frac{V_1}{V_0}}}}$$

at the same time as the changeover of the specimen supply voltage when it is assumed that an energy of the electron beam that is supplied to the E×B deflector is $eV_0$, and an energy of the outgoing electron beam that is supplied to the E×B deflector in the low energy electron microscope mode is $eV_1$.

3. The electron microscope according to claim 1 or 2, wherein the changeover from the mirror electron microscope mode to the low energy electron microscope mode is conducted by setting the specimen supply voltage to a positive potential side of the electron source supply voltage.

4. An electron beam inspection system, comprising:
electron source voltage applying means for applying an accelerating voltage to an electron source;
specimen voltage applying means for applying a specimen supply voltage to a stage that supports a specimen;
an illuminating lens system that images the illuminating electron beam emitted from the electron source onto a focal plane of an objective lens by an illuminating lens to make a planar illuminating electron beam having a two-dimensional spread illuminate the specimen;
an imaging lens system that projects and magnifies the reflecting electron beam emitted from the specimen to project and form a specimen image;
a beam separator that separates the illuminating electron beam from the reflecting electron beam;
control means for controlling the reflecting electron beam so as to go straight through the beam separator, and the illuminating electron beam so as to keep a deflection angle of the illuminating electron beam which is made by the beam separator substantially constant;
image detecting means for sequentially illuminating the planar illuminating electron beam to a plurality of illuminating areas of a specimen surface to which a negative potential is applied, imaging the reflecting electron beam generated from the specimen, sequentially forming an magnified electron image of all or a part of the plurality of illuminating areas, and converting the magnified electron image into an electric image signal;
image processing means for detecting a pattern defect formed on the specimen on the basis of the image signals;
means for changing over the reflecting electron beam to mirror electrons that are returned back in the vicinity of the surface of the specimen without colliding with the specimen, and the secondary electrons or the backscattered electrons which are generated from the specimen with colliding the primary electron beam with the specimen by controlling the accelerating voltage and the specimen supply voltage;
a mirror electron microscope mode that magnifies and projects the mirror electrons, and a low energy electron microscope mode that detects, enlarges and projects the secondary electrons or the backscattered electrons; and
means for changing over the mirror electron microscope mode and the low energy electron microscope mode to detect a pattern defect formed in the specimen;
wherein the changeover from the mirror electron microscope mode to the low energy electron microscope mode is conducted by supplying a deflection voltage and a supply current which are obtained by multiplying a deflection voltage and a supply current of the E×B deflector by a value of $\gamma$ that is represented by the following expression $$\gamma = \sqrt{\frac{V_0}{V_1} \frac{2}{1+\sqrt{\frac{V_1}{V_0}}}}$$

at the same time as the changeover of the specimen supply voltage when it is assumed that an energy of the electron beam that is supplied to the E×B deflector is $eV_0$, and an energy of the outgoing electron beam that is supplied to the E×B deflector in the low energy electron microscope mode is $eV_1$.

5. The electron beam inspection system according to claim 4, wherein the beam separator is formed of an E×B deflector that makes an electric field and a magnetic field orthogonal to each other and superimposed on one another, and the control means controls a voltage and a current which are supplied to the deflector so that a Wien condition by which the deflections caused by the electric field and the magnetic field cancel each other is met with respect to the reflecting electron beam while keeping the deflection angle with respect to the illuminating electron beam substantially constant.

6. The electron beam inspection system according to claim 4, wherein the image processing means compares the image signals related to the plurality of illuminating areas with each other, or compares the image signals with an image signal related to a desired inspection area of a specimen that is standard, which is stored in advance, to detect a pattern defect formed in the specimen and display the defect as an image.

* * * * *